(12) United States Patent
Fackenthal et al.

(10) Patent No.: US 10,198,195 B1
(45) Date of Patent: Feb. 5, 2019

(54) WEAR LEVELING

(71) Applicant: Micron Technology, Inc., Boise, ID (US)

(72) Inventors: Richard E. Fackenthal, Carmichael, CA (US); Duane R. Mills, Shingle Springs, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/669,290

(22) Filed: Aug. 4, 2017

(51) Int. Cl.
*G11C 11/34* (2006.01)
*G06F 3/06* (2006.01)
*G06F 12/02* (2006.01)
*G11C 14/00* (2006.01)

(52) U.S. Cl.
CPC .......... *G06F 3/0616* (2013.01); *G06F 3/0659* (2013.01); *G06F 3/0665* (2013.01); *G06F 3/0685* (2013.01); *G06F 12/0246* (2013.01); *G11C 14/0027* (2013.01); *G06F 3/0688* (2013.01); *G06F 2212/7201* (2013.01); *G06F 2212/7211* (2013.01)

(58) Field of Classification Search
CPC .................................................. G11C 14/0027
See application file for complete search history.

(56) References Cited

U.S. PATENT DOCUMENTS

| | | | |
|---|---|---|---|
| 9,697,913 B1 | 7/2017 | Mariani et al. | |
| 2007/0083698 A1 | 4/2007 | Gonzalez et al. | |
| 2007/0253254 A1* | 11/2007 | Morooka | G11C 16/0483 365/185.18 |
| 2008/0055997 A1* | 3/2008 | Lee | G11C 16/349 365/185.18 |
| 2010/0318719 A1 | 12/2010 | Keays et al. | |
| 2012/0324155 A1 | 12/2012 | Cherubini et al. | |
| 2015/0347038 A1* | 12/2015 | Monteleone | G06F 3/0616 711/103 |
| 2016/0225461 A1 | 8/2016 | Tuers et al. | |
| 2017/0109065 A1* | 4/2017 | Kim | G06F 3/0611 |

OTHER PUBLICATIONS

International Search Report and Written Opinion from related International application No. PCT/US2018/043414, dated Nov. 9, 2018, 16 pp.

\* cited by examiner

*Primary Examiner* — Uyen B Tran
(74) *Attorney, Agent, or Firm* — Brooks, Cameron & Huebsch, PLLC

(57) ABSTRACT

In an example, a portion of a memory array may be selected to be wear leveled based on how often the portion is or is to be accessed. The portion may be wear leveled.

8 Claims, 6 Drawing Sheets

WEAR LEVELING

TECHNICAL FIELD

The present disclosure relates generally to electronic systems, such as computing systems and/or memory systems, and, more particularly, to wear leveling, such as in memory.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric-random-access memory (FeRAM), or the like. Hard disc drives (HDDs) may be an example of another type of memory and may include magnetic tapes and/or optical discs.

The endurance of a memory may be defined as the number of writes, such as the number of write/erase (e.g., program/erase) cycles, that the memory may endure before it can no longer reliably store data (e.g., before it is likely to fail). For example, non-volatile memories may have lower endurance than DRAM.

In some examples, non-volatile memories may be divided into groups of memory cells, such as pages of memory cells, blocks of memory cells, etc. For example, some groups of memory cells may be subjected to higher numbers of writes than others and may be more likely to fail than groups subjected to lower numbers of writes. For example, a memory may be considered to be likely to fail when one or more of its groups of memory cells has a high write/erase cycle count, while other groups might have a low write/erase cycle count.

In some examples, endurance may be improved by using wear leveling. Wear leveling may spread the writes across the groups of memory cells. For example, groups with higher write/erase cycle counts may be replaced with groups with lower write/erase cycle counts during wear leveling.

DETAILED DESCRIPTION

Figure 1:
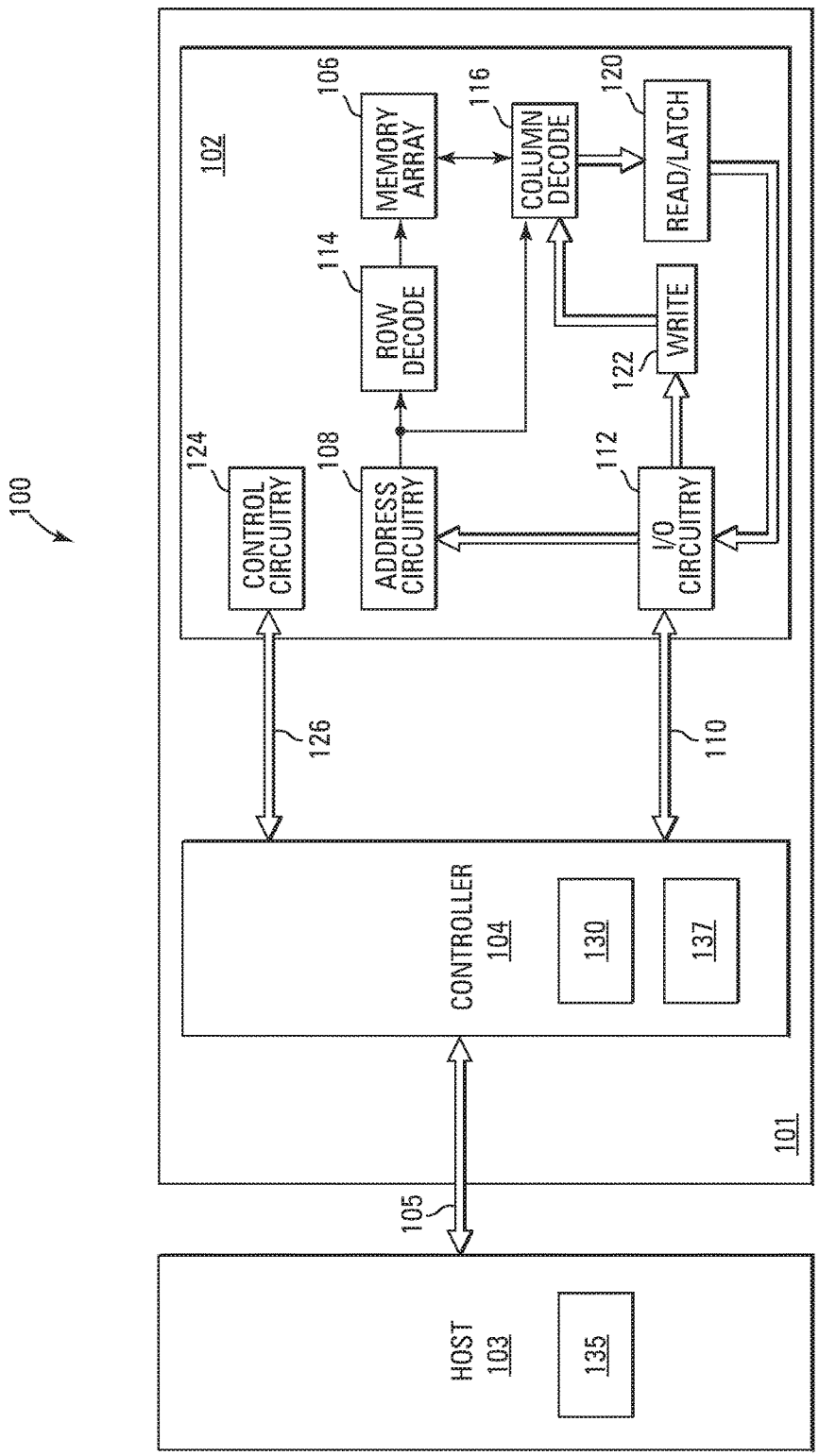
FIG. 1 is a block diagram that illustrates an example of an apparatus in accordance with a number of embodiments of the present disclosure.

In an example, a portion of a memory array may be selected to be wear leveled based on how often the portion is or is to be accessed. The portion may be wear leveled. A number of embodiments of the present disclosure provide benefits, such as reduced bandwidth usage and/or reduced power consumption due to wear leveling compared to previous apparatus, such as memory systems.

In the following detailed description, reference is made to the accompanying drawings that form a part hereof, and in which is shown, by way of illustration, specific examples. In the drawings, like numerals describe substantially similar components throughout the several views. Other examples may be utilized and electrical changes may be made without departing from the scope of the present disclosure. The following detailed description is, therefore, not to be taken in a limiting sense, and the scope of the present disclosure is defined only by the appended claims and equivalents thereof.

In some existing memory, wear leveling may be applied to the entire memory array regardless of the usage of certain portions of the array. For example, wear leveling may be applied to portions of the memory array that might not need it, thereby consuming bandwidth and power. This problem may be exacerbated as memory densities increase.

A memory array may include a plurality of groups of memory cells, such as pages of memory cells, blocks of memory cells, etc. In examples of existing wear-leveling schemes, such as round-robin schemes, a spare group of memory cells may replace an existing group, and the existing group may be made a spare group. For example, a logical address associated with the existing group may be remapped to the location of the spare group in the array in place of the location of the existing group in the array.

FIG. 1 is a block diagram of an apparatus, such as an electronic system 100, in accordance with a number of embodiments of the present disclosure. Electronic system 100 may include a memory system, such as a memory 101 (e.g., an FeRAM), coupled to an apparatus (e.g., a controller), such as a host 103 (e.g., a system on a chip (SOC)). In some examples, host 103 may be a portion of a computing system, such as in a personal computer, a hand-held device, a cell phone, etc. Host 103 may act as an interface between a processor, such as a central processing unit (CPU), of the computing system and memory 101, for example.

The term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

Memory 101 may include a memory device 102 and a controller 104, such as a memory controller. Controller 104 might include a processor, for example. Controller 104 may receive command signals (or commands), address signals (or addresses), and data signals (or data) from host 103 over connections 105 and may output data to the host 103 over connections 105.

Memory device 102 may include a memory array 106 of memory cells. In some examples, memory array 106 may be divided into portions, such as banks (e.g., partitions).

Figure 5A:
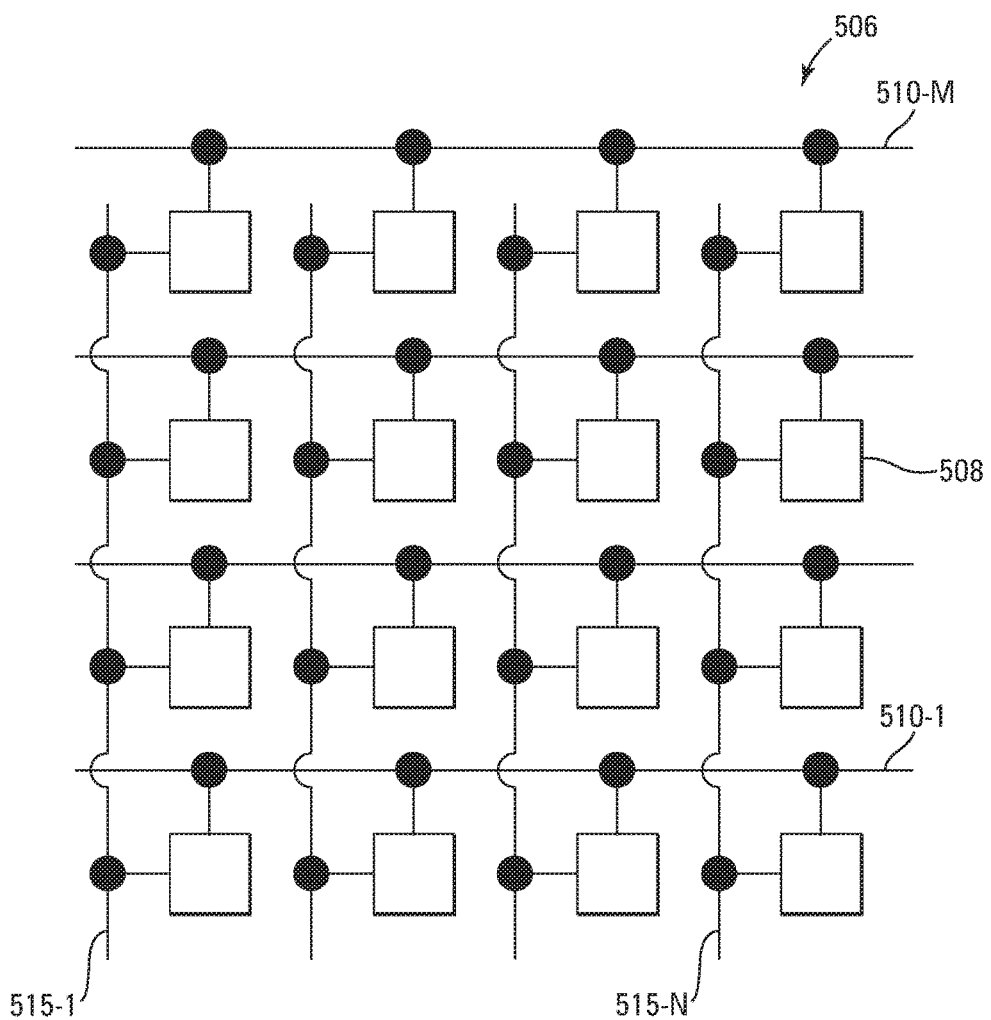
FIG. 5A illustrates an example of a memory array in accordance with a number of embodiments of the present disclosure.

Memory array 106 may include, for example, a cross-point memory array (e.g., a three-dimensional cross-point memory array), an array of ferroelectric memory cells, such as array 506 in FIG. 5A, a flash memory array (e.g., a NAND flash memory array), etc.

Memory device 102 may include address circuitry 108 to latch address signals provided over I/O connections 110 through I/O circuitry 112. Address signals may be received and decoded by a row decoder 114 and a column decoder 116 to access the memory array 106.

Memory device 102 may read data in memory array 106 by sensing voltage and/or current changes in the memory array columns using sense/buffer circuitry that in some examples may be read/latch circuitry 120. Read/latch circuitry 120 may read and latch data from the memory array 106. I/O circuitry 112 may be included for bi-directional data communication over the I/O connections 110 with controller 104. Write circuitry 122 may be included to write data to memory array 106.

Control circuitry 124 may decode signals provided by control connections 126 from controller 104. These signals may include chip enable signals, write enable signals, and address latch signals that are used to control the operations on memory array 106, including data read, data write, and data erase operations.

Control circuitry 124 may be included in controller 104, for example. Controller 104 may include, other circuitry, firmware, software, or the like, whether alone or in combination. Controller 104 may be an external controller (e.g., in a separate die from the memory array 106, whether wholly or in part) or an internal controller (e.g., included in a same die as the memory array 106). For example, an internal controller might be a state machine or a memory sequencer. In some examples, where controller 104 might be an internal controller, controller 104 might be part of memory device 102.

Controller 104 may include one or more registers 130 (e.g., latches). In some examples, a state of (e.g., a value in) a register 130 may indicate whether a corresponding portion of array 106 is selected to be wear leveled and is thus to be wear leveled in response to a wear-leveling command received over connections 105 at controller 104 from host 103. For example, the state of a register 130 (e.g., either logical high or logical low) may be set, in response to a wear-leveling set-up command received over connections 105 at controller 104 from host 103, to indicate whether a corresponding portion of array 106 is selected for wear leveling and is thus to be wear leveled in response to a wear-leveling command from host 103. In other examples, a register 130 may store an address of a last accessed (written, read, and/or erased) portion of array 106. For example, the last accessed portion (e.g., only the last accessed portion) of array 106 may be selected for wear leveling and thus may be wear leveled in response to a wear leveling command.

In some examples, host 103 may keep track of the number of times each portion of array 106 is accessed. For example, host 103 may keep track of the number of times each portion of array 106 is written to or the number of write/erase cycles that are performed on each portion of array 106. Host 103 may include one or more counters 135 to count of the of the number of times a portion of array 106 is accessed, such as the number of times the portion is written to or the number of times a write/erase cycle is performed on the portion (e.g., the number of write/erase cycles). For example, there may be a counter 135 for each portion of array 106. The count of a counter 135 may be reset (e.g., to zero) at power up of system 100, for example.

In some examples, refresh signals (e.g., refresh commands), such as the type that may be commonly used for DRAM, may be provided by connections 105. For example, a refresh command might be used instead of a wear-leveling command to initiate (e.g., trigger) wear leveling. During a typical DRAM refresh, for example, data may be read from a memory location, and the read data may be written back to that memory location.

In some examples, controller 104 may include an address converter, such as an address conversion table 137. For example, address conversion table 137 may convert logical addresses received from host 103 to locations (e.g., physical addresses of locations) of groups of memory cells within memory array 106. In some examples, there may be a dedicated address conversion table 137 for each portion of memory array 106 that may convert logical addresses, corresponding to that portion, from host 103 to physical addresses for that portion.

Figure 2:
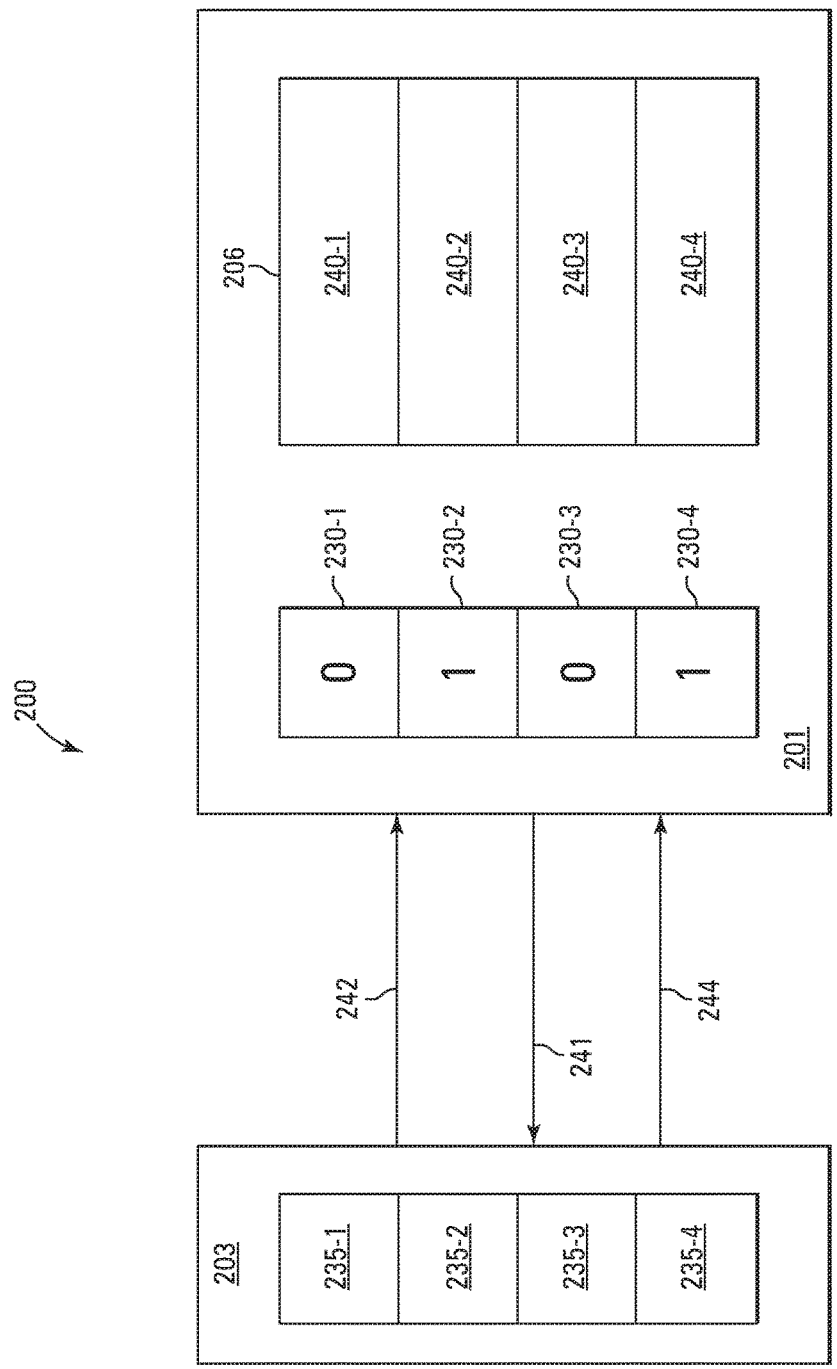
FIG. 2 is a block diagram that illustrates another example of an apparatus in accordance with a number of embodiments of the present disclosure.

FIG. 2 is a block diagram of an example of an apparatus, such as an electronic system 200 that may be a portion of electronic system 100 in accordance with a number of embodiments of the present disclosure. For example, electronic system 200 may include a memory 201, that may be a portion of memory 101, coupled to a host 203 that may be a portion of host 103. For example, memory 201 may include a controller, such as controller 104, coupled to a memory device, such as memory device 102. In some examples, the controller of memory 201 might be part of the memory device of memory 201 (e.g., and memory 201 might be referred to as a memory device).

Memory 201 may include a memory array 206 that may be a portion of memory array 106 and that may be divided into a plurality of portions 240, such as banks (e.g., partitions). For example, memory array 206 may include portions 240-1 to 240-4. However, the number of portions 240 might not be limited to four portions. Each portion 240 may be addressed individually and may be accessed individually. For example, each portion 240 may be written, read, and/or erased individually. In some examples, a read command and a write command may include an address of a particular one of portions 240-1 to 240-4. Moreover, each portion 240 may be wear leveled individually and independently of the other portions 240. Each portion 240 may, for example, include a plurality of groups of memory cells, such as pages of memory cells, blocks of memory cells, etc.

Memory 201 may include registers 230-1 to 230-4, such as mode registers, (e.g., latches) that may be a portion of the register 130 in FIG. 1 in accordance with a number of embodiments of the present disclosure. Respective ones of registers 230-1 to 230-4 may respectively correspond to corresponding ones of portions 240-1 to 240-4.

Counters 235-1 to 235-4 may be a portion of the counter 135 in FIG. 1 in accordance with a number of embodiments of the present disclosure. However, the number of counters might not be limited to four. In some examples, respective ones of counters 235-1 to 235-4 of host 203 may respectively correspond to corresponding ones of portions 240-1 to 240-4. A counter 235 may count the number of times a corresponding one of portions 240-1 to 240-4 is accessed. For example, a signal 241 may be sent to a counter 235 that may increment the count each time the corresponding portion 240 is accessed. For example, the count may indicate the number of times the corresponding portion 240 has been accessed.

Wear-leveling may be performed on certain selected ones of portions 240-1 to 240-4 in response to a command 242 that may be a wear-leveling command or a refresh command from host 203. In some examples, the state of a register 230 may indicate whether the corresponding one of portions 240 is to be wear-leveled in response to a command 242. For example, a logical high, such as a logical one (1), may be stored in a register 230 to select a corresponding one of portions 240 to be wear-leveled in response to a command 242, and a logical low, such as a logical zero (0), may be stored in a register 230 whose corresponding portion 240 is to be ignored (e.g., is not selected to be wear leveled) in response to a command 242. Although a logical high in a register 230 may be used to indicate that the corresponding portion 240 is to be wear leveled (e.g., to select the corresponding portion 240 to be wear leveled), and a logical low in a register 230 may be used to indicate that the corresponding portion 240 is not to be wear leveled (e.g., to not select the corresponding portion 240 to be wear leveled), in other examples, the roles of logical high and logical low may be reversed.

In some examples, host 203 may know in advance which of the portions 240 might be accessed most frequently. For example, the portions 240 that may be accessed most frequently may be wear leveled in response to a command 242, whereas those portions that may be accessed relatively infrequently may not be wear leveled in response to a command 242 For example, the portions 240 that may be accessed most frequently may be selected to be wear leveled, whereas those portions that may be accessed relatively infrequently may not be selected to be wear leveled.

In some examples, host 203 may send a setup command 244 to memory 201 that may indicate to memory 201 which registers 230 are to be set to a state (e.g., a logical high) that indicates wear leveling is to be performed on the corresponding portions 240 based on how often those corresponding portions 240 are to be accessed and which registers 230 are to be set to a state (e.g., a logical low) that indicates wear leveling is not to be performed on the corresponding portions 240 based on how often those corresponding portions 240 are to be accessed. The registers 230 may be set in response to this command. For example, respective ones of registers 230-1 to 230-4 may respectively indicate whether corresponding ones of portions 240-1 to 240-4 are (e.g., whether corresponding ones of portions 240-1 to 240-4 are selected) to be wear leveled based on how often the corresponding ones of portions 240-1 to 240-4 are to be respectively accessed. In some examples, a register 230 may be set to indicate that the corresponding portion 240 is to be wear leveled in response to the number (e.g., expected number) of accesses to be performed being greater than or equal to a certain number.

A setup command 244 may be sent to memory 201 each time system 200 is powered up (e.g., once per power up), for example. In some examples, host 203 may write a state to a register 230 based on whether wear leveling is to be performed on the corresponding portion 240.

In some examples, a logical low in a register 230 may act to prevent (e.g., lock out) the corresponding portion 240 from being wear leveled so that only portions 240 corresponding to registers 230 having a logical high may be (e.g., selected to be) wear leveled in response to command 242. In the example of FIG. 2, the logical zeros in registers 230-1 and 230-3 may act to respectively prevent portions 240-1 and 240-3 from being wear leveled in response to command 242 so that only portions 240-2 and 240-4 respectively corresponding to registers 230-2 and 230-4 having logical ones may be wear leveled in response to command 242. For example, only portions 240-2 and 240-4 may be selected to be wear leveled.

Host 203 may monitor the counts on counters 235. When a count of a counter 235 is greater than or equal to a certain value (e.g., representing a certain number of accesses to the corresponding portion 240), host 203 may set the corresponding register 230 to a logical high, such as by writing a logical one in the corresponding register 230 or by sending a setup command 244 that causes memory 201 to store a logical one in the corresponding register 230. For the example of FIG. 2, in response to the count on counter 235-1 becoming greater than or equal to the certain value, host 203 may cause the value in the corresponding register 230-1 to be changed to a logical one from a logical zero (e.g., by sending a setup command 244 to memory 201 that may cause the value to be changed or by writing the logical one in register 230-1)

In some examples, host 203 may determine the number of accesses per unit time (e.g. the rate of accesses) for each portion 240 from the count of the corresponding counter 235. For example, host 203 may set a register 230 to a logical low or high based on the rate of accesses to the corresponding portion 240. For the example of FIG. 2, in response to the rate of accesses to portion 240-1 becoming greater than or equal to a certain value, host 203 may change the value in the corresponding register 230-1 to a logical one from a logical zero, and in response to the rate of accesses to portion 240-2 being less than the certain value, host 203 may change the value in the corresponding register 230-2 to a logical zero from a logical one.

Figure 3:
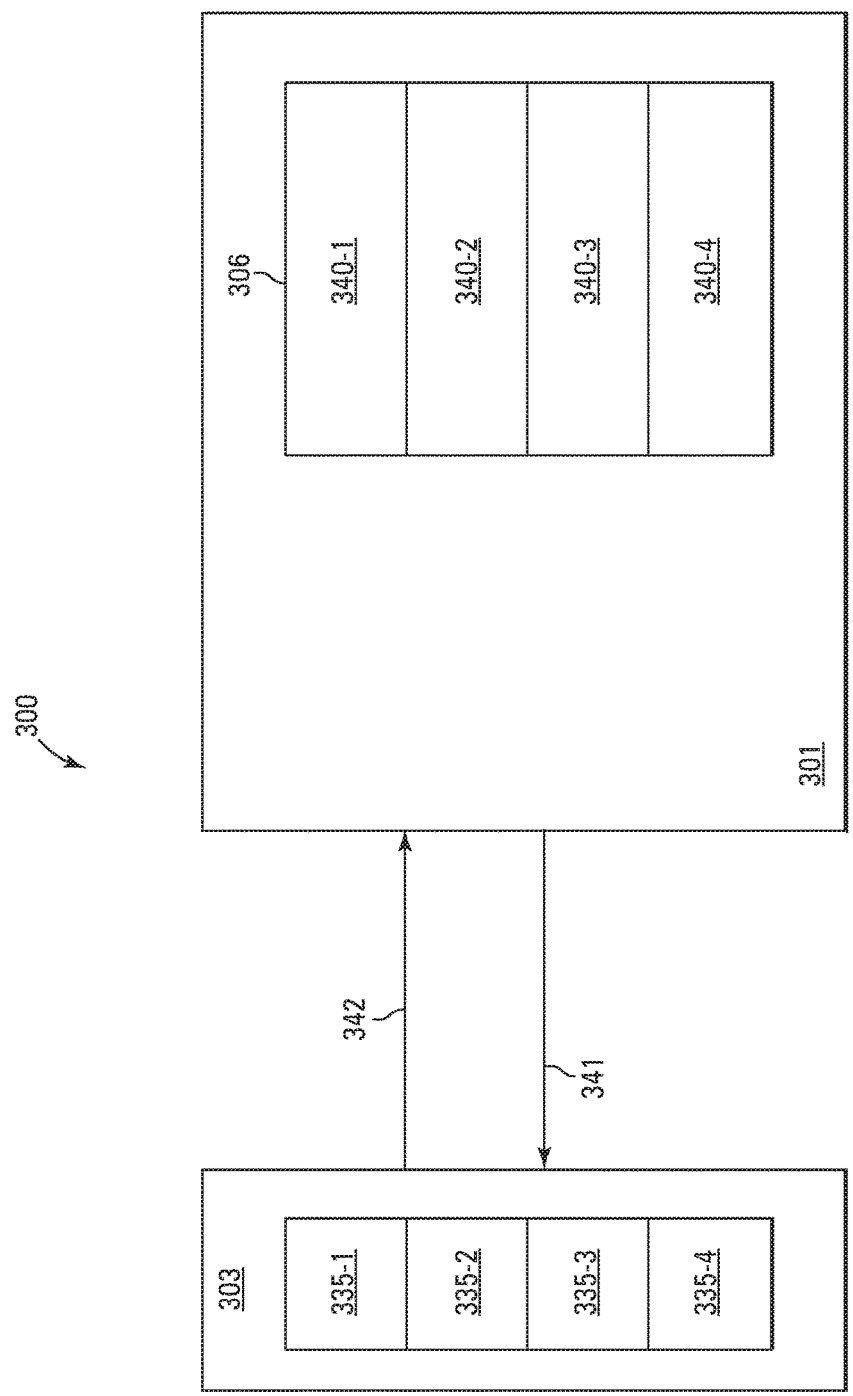
FIG. 3 is a block diagram that illustrates another example of an apparatus in accordance with a number of embodiments of the present disclosure.

FIG. 3 is a block diagram of an example of an apparatus, such as an electronic system 300 that may be a portion of electronic system 100 in accordance with a number of embodiments of the present disclosure. For example, electronic system 300 may include a memory 301, that may be a portion of memory 101, coupled to a host 303 that may be a portion of host 103. For example, memory 301 may include a controller, such as controller 104, coupled to a memory device, such as memory device 102. In some examples, the controller of memory 301 might be part of the memory device of memory 301 (e.g., and memory 301 might be referred to as a memory device).

Memory 301 may include a memory array 306 that may be a portion of memory array 106 and that may be divided into a plurality of portions 340, such as banks (e.g., partitions). For example, memory array 306 may include portions 340-1 to 340-4. However, the number of portions 340 might not be limited to four portions. Each portion 340 may be addressed individually and may be accessed individually. For example, each portion 340 may be written, read, and/or erased individually. In some examples, a read command and a write command may include an address of a particular one of portions 340-1 to 340-4. Moreover, each portion 340 may be wear leveled individually and independently of the other portions 340. Each portion 340 may, for example, include a plurality of groups of memory cells, such as pages of memory cells, blocks of memory cells, etc.

Counters 335-1 to 335-4 may be a portion of the counter 135 in FIG. 1 in accordance with a number of embodiments of the present disclosure. However, the number of counters might not be limited to four. In some examples, respective ones of counters 335-1 to 335-4 of host 303 may respectively correspond to corresponding ones of portions 340-1 to 340-4. A counter 335 may count the number of times a corresponding one of portions 340-1 to 340-4 is accessed. For example, a signal 341 may be sent to a counter 335 that may increment the count each time the corresponding portion 340 is accessed. For example, the count may indicate the number of times the corresponding portion 340 has been accessed.

A command 342, such as a wear-leveling command or a refresh command, may be sent from host 303 to memory 301 to cause (e.g., to select) portions 340 to be wear leveled. For example, command 342 may contain the addresses of particular portions 340 (e.g., selected) to be wear leveled. As such, command 342 may be referred to as a portion-directed command, for example. In some examples, command 343 may include addresses for less than all of the portions 340. For example, command 342 may include the addresses of the portions 340 that may be accessed most frequently. Note that only the portions 340 whose addresses are in command 342 may be wear leveled, for example. For example, only the portions 340 whose addresses are in command 342 are selected for wear leveling In some examples, host 303 may know in advance which of the portions 340 might be accessed most frequently, and may include the addresses of those portions in command 342. For example, an address may be included based on how often the portion having that address is (e.g., expected) to be accessed. In other examples, the addresses in command 342 may include addresses of portions that are to be excluded from wear leveling based on how often those portions are (e.g., expected) to be accessed, where those portions whose addresses do not appear are wear leveled in response to command 342. For example, the command may indicate directly only those portions that are to be wear leveled by expressly including only the addresses of those portions or may indicate indirectly only those portions that are to be wear leveled by including the addresses of only portions that are not to be wear leveled such that only the excluded addresses are to be wear leveled. In this way, for example, the command may directly or indirectly select only those portions that are to be wear leveled.

In other examples, host 303 may monitor the counts on counters 335. In response to a count of a counter 335 becoming greater than or equal to a certain value (e.g., representing a certain number of accesses to the corresponding portion 340), host 303 may add the address of the corresponding portion 340 to command 342.

In some examples, host 303 may determine the number of accesses per unit time (e.g. the rate of accesses) for each portion 340 from the count of the corresponding counter 335. For example, in response to a rate of accesses to a portion 340 becoming greater than or equal to a certain value, host 303 may add the address of that portion 340 to command 342, and in response to a rate of accesses to a portion 340 becoming less than the certain value, host 303 may remove the address of that portion 340 from command 342.

Figure 4:
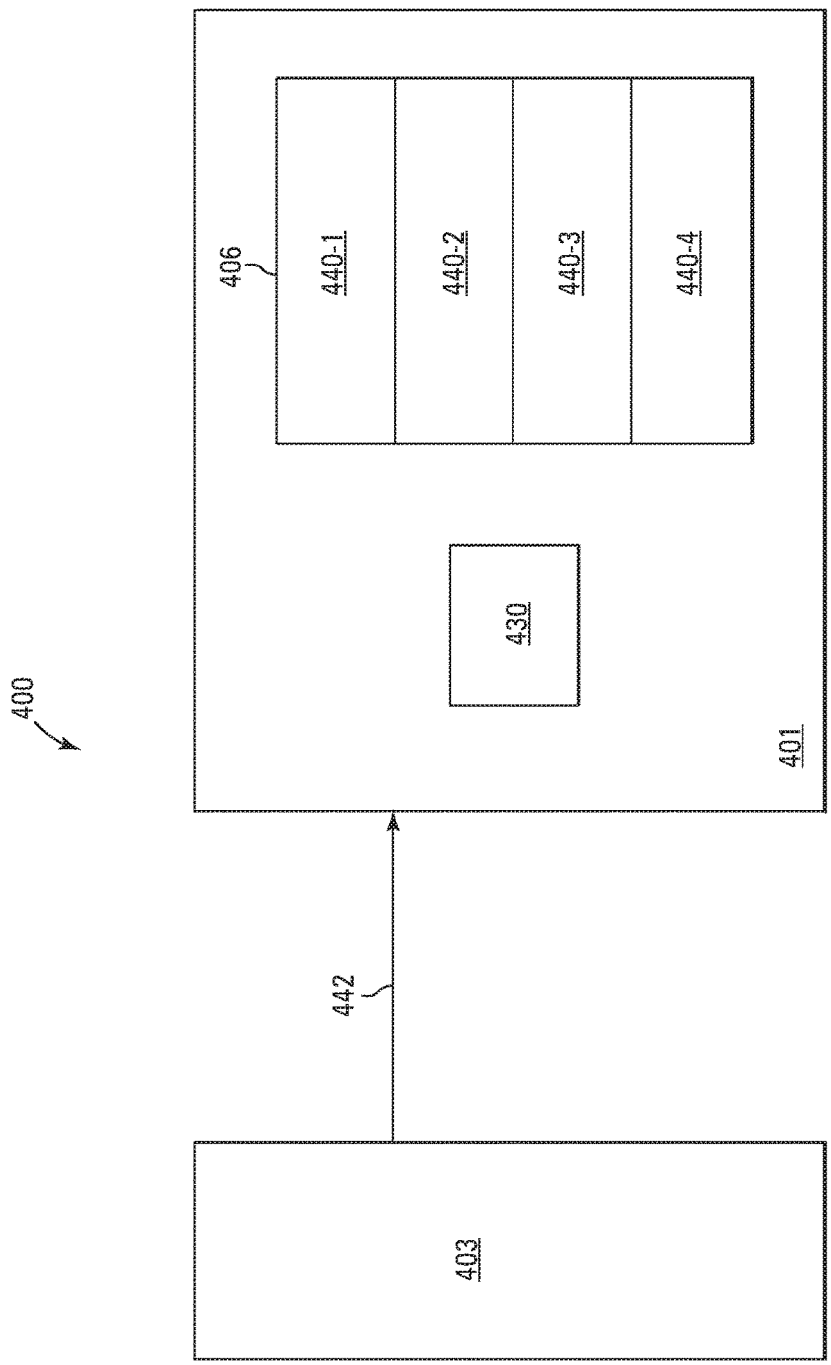
FIG. 4 is a block diagram that illustrates another example of an apparatus in accordance with a number of embodiments of the present disclosure.

FIG. 4 is a block diagram of an example of an apparatus, such as an electronic system 400 that may be a portion of electronic system 100 in accordance with a number of embodiments of the present disclosure. For example, electronic system 400 may include a memory 401, that may be a portion of memory 101, coupled to a host 403 that may be a portion of host 103. For example, memory 401 may include a controller, such as controller 104, coupled to a memory device, such as memory device 102. In some examples, the controller of memory 401 might be part of the memory device of memory 401 (e.g., and memory 401 might be referred to as a memory device).

Memory 401 may include a memory array 406 that may be a portion of memory array 106 and that may be divided into a plurality of portions 440, such as banks (e.g., partitions). For example, memory array 406 may include portions 440-1 to 440-4. However, the number of portions 440 might not be limited to four portions. Each portion 440 may be addressed individually and may be accessed individually. For example, each portion 440 may be written, read, and/or erased individually. In some examples, a read command and a write command may include an address of a particular one of portions 440-1 to 440-4. Moreover, each portion 440 may be wear leveled individually and independently of the other portions 440. Each portion 440 may, for example, include a plurality of groups of memory cells, such as pages of memory cells, blocks of memory cells, etc.

Host 403 may send a command 442, such as a wear-leveling command or a refresh command to memory 401. Memory 401 may include a register 430 (e.g., a latch) that may, for example, be a portion of the register 130 in FIG. 1 in accordance with a number of embodiments of the present disclosure. Register 430 may store the address of the last accessed portion 440 of the portions 440 (e.g., portions 440-1 to 440-4). Memory 401 may wear level the portion 440 whose address is in register 430 in response to receiving the next command 442 after the address is stored in register 430. For example, memory 401 may read the address in register 430 in response to command 442 and may wear level the portion 440 having that address. For example, the address of the last accessed portion 440 being in register 430 may select that portion for wear leveling.

It is expected, for example, that the number of times the address of a particular last accessed portion 440 appears in register 430 (e.g., the frequency at which the address of the particular last accessed portion 440 appears in register 430) is a measure (e.g., at least statistically) of how often that particular portion 440 is accessed. For example, those portions 440 whose addresses appear most often in register 430 are most likely to have been accessed most often, and those portions 440 whose addresses appear least often in register 430 are most likely to have been accessed least often. For example, selecting a portion 440 whose address is in register 430 may be analogous to selecting that portion 440 based on the number of accesses to that portion 440 being greater that the remaining portions 440. For example, selecting a portion 440 whose address is in register 430 may be analogous to selecting that portion based on how often that portion is or is to be accessed.

In some examples, the wear leveling discussed above may be performed as background operations, such as while read or write operations are being performed. The wear leveling to be performed on a portion of a memory array in response to a command from a host, for example, may be postponed if higher-priority (e.g., latency-critical) operations, such as some reads or writes, might need to be performed.

In some examples, each portion of a memory array, such as each portion 240 in FIG. 2, each portion 340 in FIG. 3, and each portion 440 in FIG. 4, may have its own exclusive (e.g., exclusive to all other groups) set of groups of in-use blocks and its own exclusive set of spare blocks, for example. In some examples, wear leveling in a (e.g., in each) portion of a memory array may include replacing a group of memory cells that is in use, such as an existing group, with a replacement spare group of memory cells. For example, a logical address that may be mapped to the location (e.g., physical address) of the existing group in a portion of a memory array may be remapped to the location of the replacement spare group in that portion. The logical address corresponding to the existing group may be remapped to address of the replacement spare group, for example, by changing the physical address of the existing group in an address conversion table, such as address conversion table 137, for the portion of the memory array to the physical address of the replacement spare group in that portion. For example, as indicated above in conjunction with FIG. 1, there may be a dedicated address conversion table 137 for each portion of memory array 106, such as each portion 240, 340, and 440.

The wear leveling in a portion (e.g., each portion) of a memory array may include, for example, a round-robin operation, where a spare group in a first position in a queue of spare groups (e.g., exclusively for that portion) may replace the existing group and the existing group may be placed in the last position in the queue of spare groups. In subsequent wear leveling operations, starting from the last position in the queue, a spare group may move until it reaches the first position in the queue and eventually replaces an existing block. For example, during each wear leveling, a spare group in the last position may be displaced toward the first position by an existing block that has been replaced.

FIG. 5A illustrates an example of a memory array 506, such as a ferroelectric memory array, in accordance with a number of embodiments of the present disclosure. For example, memory array 506 may be a memory array 106, 206, 306, and/or 406.

Memory array 506 may include memory cells 508 that may be programmable to store different states. A memory cell 508 may include a capacitor to store a charge representative of the programmable states. For example, a charged and uncharged capacitor may respectively represent two logic states. Memory cell 508 may include a capacitor with a ferroelectric material, in some examples. For example, ferroelectric materials may have a spontaneous electric polarization (e.g., they may have a non-zero polarization in the absence of an electric field. Different levels of charge of a ferroelectric capacitor may represent different logic states, for example.

A memory cell 508 may be coupled to a respective access line, such as a respective one of access lines 510-1 to 510-M, and a respective data (e.g., digit) line, such as one of data lines 515-1 to 515-N. For example, a memory cell 508 may be coupled between an access line 510 and a data line 515. In some examples, access lines 510 may also be referred to as word lines, and data lines 515 may also be referred to as bit lines. Access lines 510 and data lines 515, for example, may be made of conductive materials, such as copper, aluminum, gold, tungsten, etc., metal alloys, other conductive materials, or the like.

In some examples, memory cells 508 commonly coupled to an access line 510 may be referred to as a row of memory cells. For example, access lines 510 may be coupled to row decoder 114, and data lines may be coupled to column decoder 116. Operations such as reading and writing may be performed on memory cells 508 by activating or selecting the appropriate access line 510 and a data line 515 (e.g., by applying a voltage to the access line). Activating an access line 510 may electrically couple the corresponding row of memory cells 508 to their respective data lines 515.

Figure 5B:
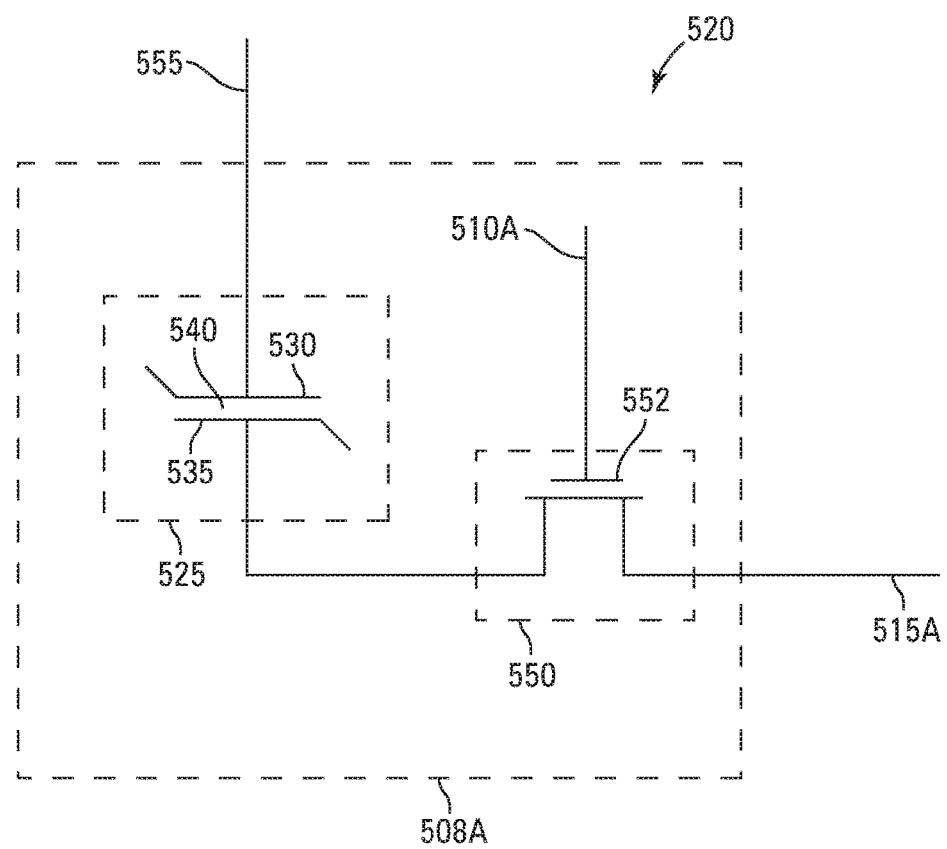
FIG. 5B illustrates an example of a memory cell in accordance with a number of embodiments of the present disclosure.

FIG. 5B illustrates an example circuit 520 that includes a memory cell 508 in accordance with a number of embodiments of the present disclosure. Circuit 520 may include a ferroelectric memory cell 508A, an access line 510A, and a data line 515A that may respectively be examples of a memory cell 508, an access line 510, and a data line 515, shown in FIG. 5A.

Memory cell 508A may include a logic storage component, such as capacitor 525 that may have a first plate, such as a cell plate 530, and a second plate, such as a cell bottom 535. Cell plate 530 and cell bottom 535 may be capacitively coupled through a ferroelectric material 540 positioned between them. The orientation of cell plate 530 and cell bottom 535 may be flipped without changing the operation of memory cell 508A.

Circuit 520 may include a select device 550, such as a select transistor. For example, the control gate 552 of select device 550 may be coupled to access line 510A. In the example of FIG. 5B, cell plate 530 may be accessed via plate line 555, and cell bottom 535 may be accessed via data line 515A. For example, select device 550 may be to selectively couple data line 515A to cell bottom 535 in response to access line 510A activating select device 550. For example, capacitor 525 may be electrically isolated from data line 515A when select device 550 is deactivated, and capacitor 525 may be electrically coupled to data line 515A when select device 550 is activated. Activating select device 550 may be referred to as selecting memory cell 508A, for example. As previously described, various states may be stored by charging or discharging capacitor 525.

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed is:

1. A method of operating an apparatus, comprising:
    selecting a portion of a memory array to be wear leveled based on how often the portion is or is to be accessed; and
    wear leveling the portion;
    wherein selecting the portion to be wear leveled comprises a host setting a first register that corresponds to the portion to allow the portion to be wear leveled and setting a number of second registers that correspond to remaining portions of the memory array to not allow the remaining portions to be wear leveled.

2. The method of claim 1, comprising setting the first register and setting the number of second registers in response to a command from the host.

3. The method of claim 1, wherein setting the first register is in response to the host determining that the portion was accessed greater than or equal to a certain number of times, and wherein setting the number of second registers to not allow the remaining portions to be wear leveled is in response to the host determining that the remaining portions were accessed less than the certain number of times.

4. The method of claim 1, wherein selecting the portion to be wear leveled comprises selecting a portion of a ferroelectric memory array to be wear leveled.

5. An apparatus, comprising:
    a host; and
    a memory coupled to the host and comprising an array of memory cells; wherein:
        the memory is configured to select a portion of a memory array to be wear leveled based on how often the portion is or is to be accessed; and the host is configured to set a first register of the memory that corresponds to the portion to allow the portion to be wear leveled and to set a number of second registers that correspond to remaining portions of the memory array to not allow the remaining portions to be wear leveled.

6. The apparatus of claim 5, wherein the host is configured to send a command that causes the memory to set the first register to allow the portion to be wear leveled and to set the number of second registers to not allow the remaining portions to be wear leveled.

7. The apparatus of claim 5, wherein the host is configured to set the first register in response to the host determining that the portion was accessed greater than or equal to a certain number of times, and wherein host is configured to set the number of second registers to not allow the remaining portions to be wear leveled in response to the host determining that the remaining portions were accessed less than the certain number of times.

8. The apparatus of claim 5, wherein the memory array is a ferroelectric memory array.

* * * * *